(12) United States Patent
Hshieh et al.

(10) Patent No.: US 6,518,621 B1
(45) Date of Patent: Feb. 11, 2003

(54) TRENCH DMOS TRANSISTOR HAVING REDUCED PUNCH-THROUGH

(75) Inventors: Fwu-Iuan Hshieh, Saratoga, CA (US); Koon Chong So, San Jose, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/395,790

(22) Filed: Sep. 14, 1999

(51) Int. Cl.[7] .............................................. H01L 29/76
(52) U.S. Cl. ...................... 257/328; 257/330; 257/332
(58) Field of Search ................................ 257/328, 327, 257/330, 332

(56) References Cited

U.S. PATENT DOCUMENTS

| | | | |
|---|---|---|---|
| 4,583,105 A | * 4/1986 | Rosenberg | 357/23.12 |
| 5,072,266 A | 12/1991 | Bulucea et al. | 357/23.4 |
| 5,468,982 A | 11/1995 | Hshieh et al. | 257/331 |
| 5,541,425 A | 7/1996 | Nishihara | 257/139 |
| 5,810,417 A | * 9/1998 | Tsang et al. | 257/333 |
| 5,854,501 A | * 12/1998 | Kao | 257/316 |
| 5,866,931 A | 2/1999 | Bulucea et al. | 257/331 |
| 5,885,877 A | * 3/1999 | Gardner et al. | 438/300 |
| 6,051,488 A | * 4/2000 | Lee et al. | 438/589 |
| 6,057,558 A | * 5/2000 | Yamamoto et al. | 257/77 |
| 2001/0008788 A1 | * 7/2001 | Hshieh et al. | 438/270 |

FOREIGN PATENT DOCUMENTS

JP        61190981        8/1986        ........... H01L/29/78

* cited by examiner

*Primary Examiner*—Olik Chaudhuri
*Assistant Examiner*—Wai-Sing Louie
(74) *Attorney, Agent, or Firm*—Mayer Fortkort & Williams, PC; Stuart H. Mayer, Esq.; Karin L. Williams, Es (57) ABSTRACT

A method of forming a trench DMOS transistor is provides which reduces punch-through. The method begins by providing a substrate of a first conductivity type. A body region, which has a second conductivity type, is formed on the substrate. A masking layer is formed which defines at least one trench. Next, the trench and an insulating layer that lines the trench are formed. A conductive electrode is then formed in the trench, which overlies the insulating layer. A source region of the first conductivity type is formed in the body region adjacent to the trench. The step of forming the trench includes the steps of etching the trench and smoothing the sidewalls of the trench with a sacrificial oxide layer before removal of the masking layer that defines the trench.

4 Claims, 6 Drawing Sheets

TRENCH DMOS TRANSISTOR HAVING REDUCED PUNCH-THROUGH

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use diffusion to form the transistor regions. DMOS transistors are typically employed as power transistors to provide high voltage circuits for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541,425, and 5,866,931.

One problem with trench DMOS transistors is known as punch-through. Punch-through, which arises when the transistor channel is depleted, typically takes the form of a non-destructive leakage current prior to avalanche breakdown. It has been found that punch-through is particularly deleterious at higher transistor cell densities, notably at densities greater than about 18M/in2. Among the various causes of punch-through, one significant cause occurs during the formation of the trench gate. In particular, after the trench has been etched a sacrificial oxidation step is performed to smooth the trench sidewalls, which is then followed by deposition of the thin oxide layer. During the sacrificial oxidation and oxide deposition steps, dopant material leaches out of the adjacent channel (the so-called p-body) because dopant material (typically boron), segregates from the silicon into the gate oxide during the sacrificial oxidation step, which is performed at high temperatures. This problem is exacerbated at higher cell densities because the relative width of the channel decreases with respect to the surface area encompassed by the trench.

Punch-through is also aggravated when polysilicon is deposited to fill the trench because the dopant (typically phosphorous) employed in the polysilicon can penetrate through the gate into the p-body, which effectively reduces the concentration of carriers in the channel. This problem becomes more severe as the thickness of the gate oxide layer lining the trench is reduced.

U.S. Pat. No. 5,072,266 discloses a conventional sequence of processing steps that are employed to fabricate a trench DMOS transistor. In this process the p-body channel and the source regions are formed before the trench. As previously mentioned, however, during the formation of the trench dopant materials can leach out of the p-body, increasing punch-through. As a result, the depth of the trench and the p-body must be increased to compensate for the increase in punch-through. Moreover, the source regions may also be adversely effected during the formation of the trench because of silicon defects produced in the source regions during the oxidation steps used in forming the trench gate.

U.S. Pat. No. 5,468,982 attempts to reduce punch-through by forming the p-body after the trench gate has been etched and filled. This approach is not entirely satisfactory, however, since the formation of the p-body requires a diffusion step that involves high temperatures (typically 1100–1150 C). The high temperatures allow the dopant material in the polysilicon that fills the trench to penetrate through the gate oxide at a greater rate, thus contributing to an increase in punch-through.

Accordingly, there remains a need for a process of fabricating a trench DMOS transistor that substantially reduces punch-through.

SUMMARY OF THE INVENTION

The present invention provides a method of forming a trench DMOS transistor. The method begins by providing a substrate of a first conductivity type. A body region, which has a second conductivity type, is formed on the substrate. A masking layer is formed which defines at least one trench. Next, the trench and an insulating layer that lines the trench are formed. A conductive electrode is then formed in the trench, which overlies the insulating layer. A source region of the first conductivity type is formed in the body region adjacent to the trench. The step of forming the trench includes the steps of etching the trench and smoothing the sidewalls of the trench with a sacrificial oxide layer before removal of the masking layer that defines the trench.

Because the present invention advantageously completes the steps of trench formation prior to removal of the patterned trench mask, dopant material is prevented from leaching leach out of the p-body since the patterned trench mask serves as a cap or barrier. Thus, punch-through is reduced.

In accordance with another aspect of the invention, the conductive electrode is formed from polysilicon. The step of forming the polysilicon conductive electrode may include the steps of depositing a layer of undoped polysilicon followed by a layer of doped polysilicon. These steps also reduces punch-through because the undoped polysilicon layer serves as a buffer layer to inhibit the penetration of dopant material through the insulating layer and into the body region.

DETAILED DESCRIPTION

Figure 1:
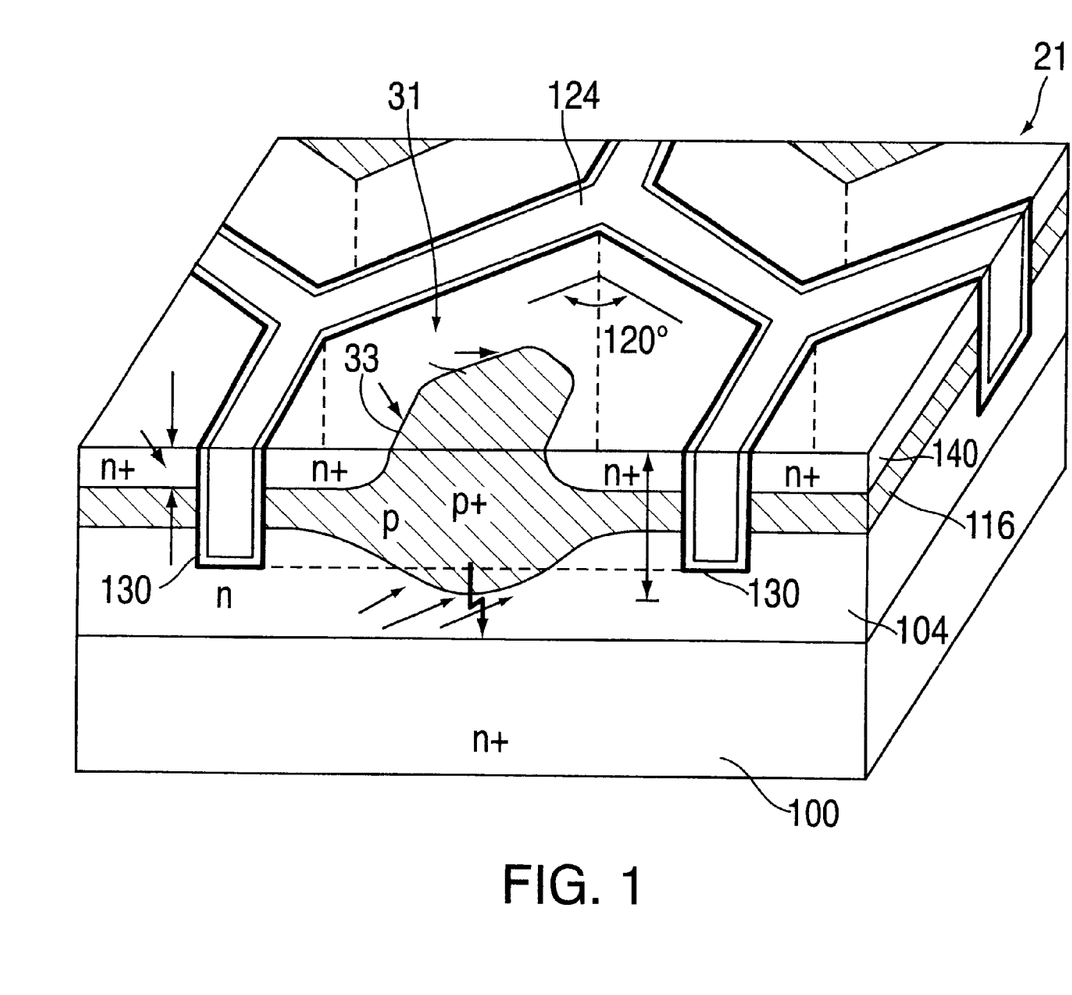
FIG. 1 shows a schematic cross-sectional view of one embodiment of a trench DMOS transistor constructed in accordance with the present invention.

FIG. 1 illustrates one embodiment of the present invention, showing half of a hexagonally shaped trench DMOS structure 21. The structure includes, in this embodiment, an n+substrate 100 on which is grown a lightly n-doped epitaxial layer 104. Within doped epitaxial layer 104, a body region 116 of opposite conductivity is provided. An n-doped epitaxial layer 140 that overlies most of the body region 116 serves as the source. A hexagonally shaped trench 124 is provided in the epitaxial layers, which is open at the upper surface of the structure. The trench 124 associated with a transistor cell defines a cell region 31 that is also hexagonally shaped in horizontal cross-section. Within the cell region 31, the body region 116 rises to the upper surface of the structure and forms an exposed pattern 33 in a horizontal cross section at the top surface of the cell region.

The MOSFET shown in FIG. 1 has its gate positioned in a vertically oriented rectangular trench. This structure is often called a trench vertical DMOSFET. It is "vertical" because the drain contact appears on the back or underside of the substrate and because the channel flow of current from source to drain is approximately vertical. This minimizes the higher resistance associated with bent or curved current paths or with parasitic field effect construction. The device is also doubly diffused (denoted by the prefix "D") because the source region is diffused into the epitaxial material on top of a portion of the earlier-diffused body region of opposite conductivity type. This structure uses the trench side wall area for current control by the gate and has a substantially vertical current flow associated with it. As previously mentioned, this device is particularly appropriate for use as a power switching transistor where the current carried through a given transverse silicon area is to be maximized.

It should be noted that the transistor cell 31 need not have a hexagonal shape for basic transistor operation, but more generally may have any polygonal shape. However, a regular rectangular shape and a regular hexagonal shape are the most convenient for layout purposes. Alternatively, rather than having a closed-cell geometry as depicted in the figures, the transistor cell may have an open or stripe geometry. Examples of various transistor cell geometries are shown in the previously mentioned references. Moreover, it should also be noted that in FIG. 1 and the figures that follow only the substrate, its associated doped regions and the trench are shown. Other layers such as overlying insulating layers, gate structures and conductive interconnects are not shown for the sake of clarity and are well known to those of ordinary skill in the art.

Figure 2:
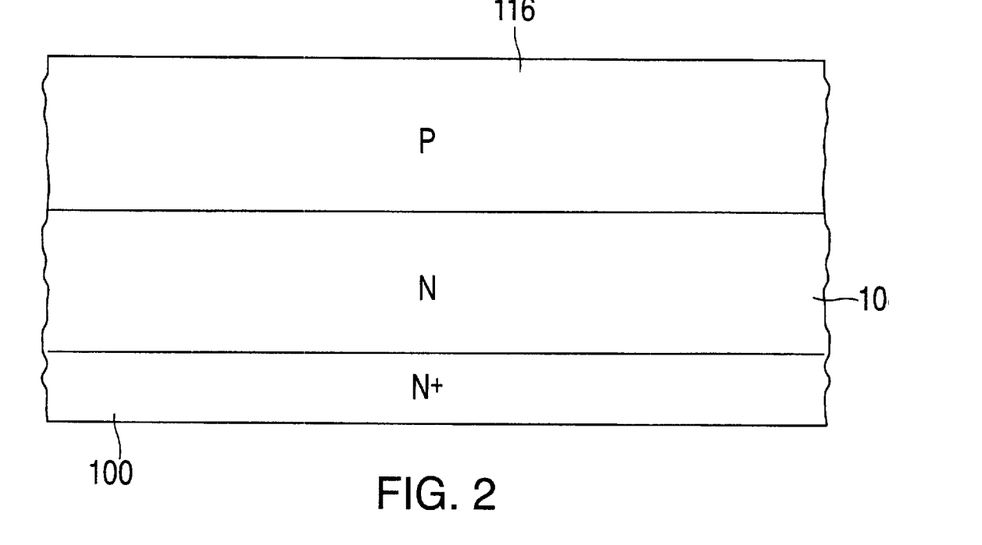
FIGS. 2–7 illustrates a sequence of process steps forming the DMOS transistor of FIG. 1 in accordance with the present invention.

FIGS. 2–7 shows the steps that are performed to form the DMOS device depicted in FIG. 1. In FIG. 2, an N– doped epitaxial layer 104 is grown on a conventionally N+ doped substrate 100. Epitaxial layer 104 is typically 5.5 microns in thickness for a 30 V device. Next, P-body region 116 is formed in an implantation and diffusion step. Since the P-body implant is uniform across the substrate, no mask is needed. The P-body regions are boron implanted at 40 to 60 KEV with a dosage of $5.5 \times 10^3/cm^3$.

Figure 3:
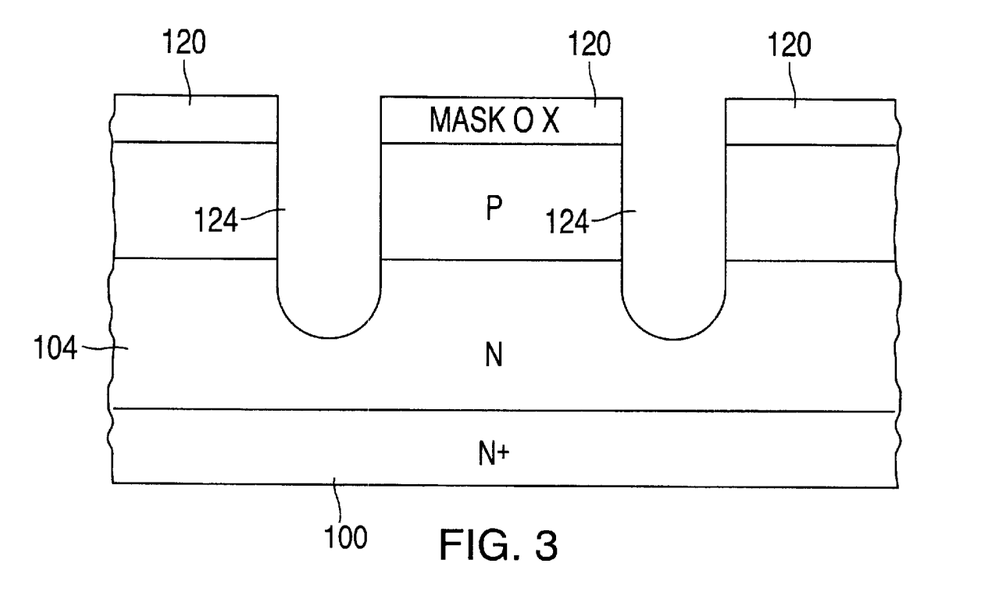

In FIG. 3 a mask layer is formed by covering the surface of epitaxial layer 104 with an oxide layer, which is then conventionally exposed and patterned to leave mask portions 120. Mask portions 120 are used for defining the location of the trenches. Trenches 124 are dry etched through the mask openings by reactive ion etching to a depth that typically ranges from 1.5 to 2.5 microns.

Figure 4:
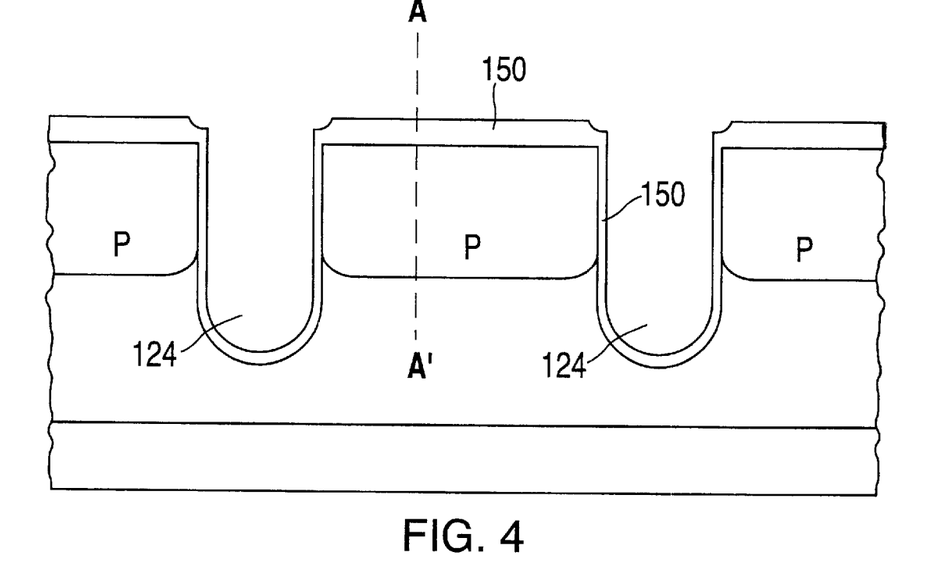

In FIG. 4, the sidewalls of each trench are smoothed. In accordance with the present invention, this process step is performed while trench mask portions 120 are still in place. First, a dry chemical etch may be used to remove a thin layer of oxide (typically about 500–1000 A) from the trench sidewalls to eliminate damage caused by the reactive ion etching process. Next, a sacrificial silicon dioxide layer 150 is grown over trenches 124 and mask portions 120. The sacrificial layer 150, as well as mask portions 120, are removed either by a buffer oxide etch or an HF etch so that the resulting trench sidewalls are as smooth as possible.

Because the present invention completes the steps of trench formation prior to removal of the patterned trench mask, dopant material does not leach out of the p-body since the patterned trench mask serves as a cap or barrier. In contrast, in previously mentioned U.S. Pat. No. 5,072,266, the trench mask is removed before performing the sacrificial oxide step, thus allowing dopant material to leach out of the p-body. Since the present invention avoids this problem encountered with the prior art technique, punchthrough is reduced.

Figure 5:
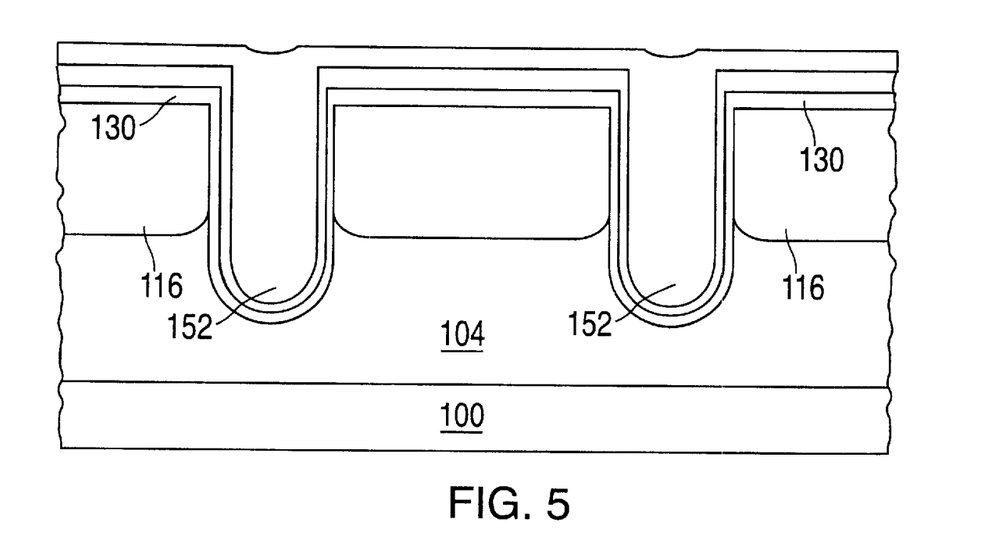

As shown in FIG. 5, the gate oxide layer 130 is then deposited on the entire structure so that it covers the trench walls and the surface of p-body 116. Gate oxide layer 130 typically has a thickness in the range of 500–800 angstroms. Next, the trenches 124 are filled with polysilicon 152, i.e., polycrystalline silicon. Prior to deposition, the polysilicon is typically doped with phosphorous chloride or implanted with arsenic or phosphorous to reduce its resistivity, typically within the range of 20 Ω/m.

Figure 6:
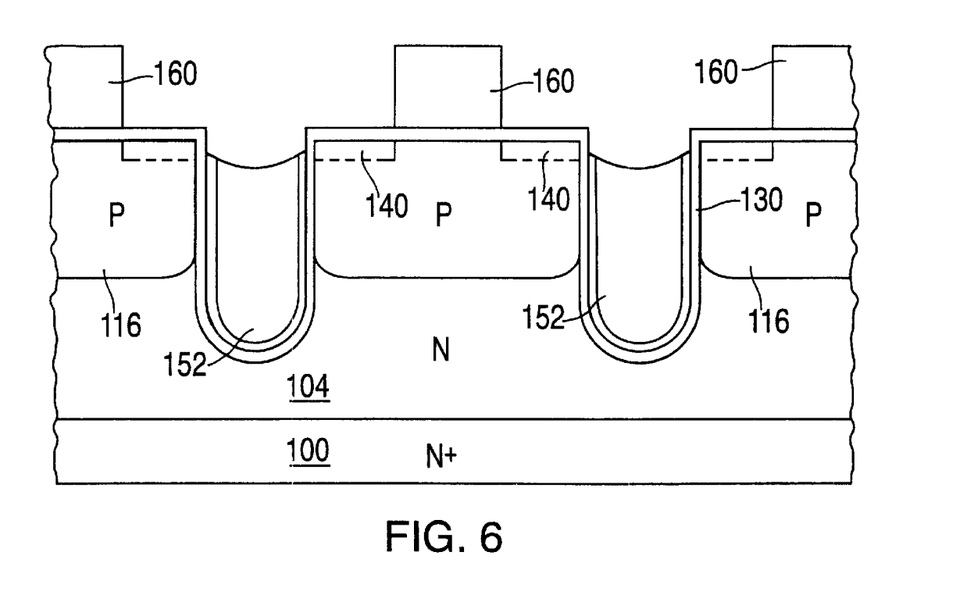
Figure 7:
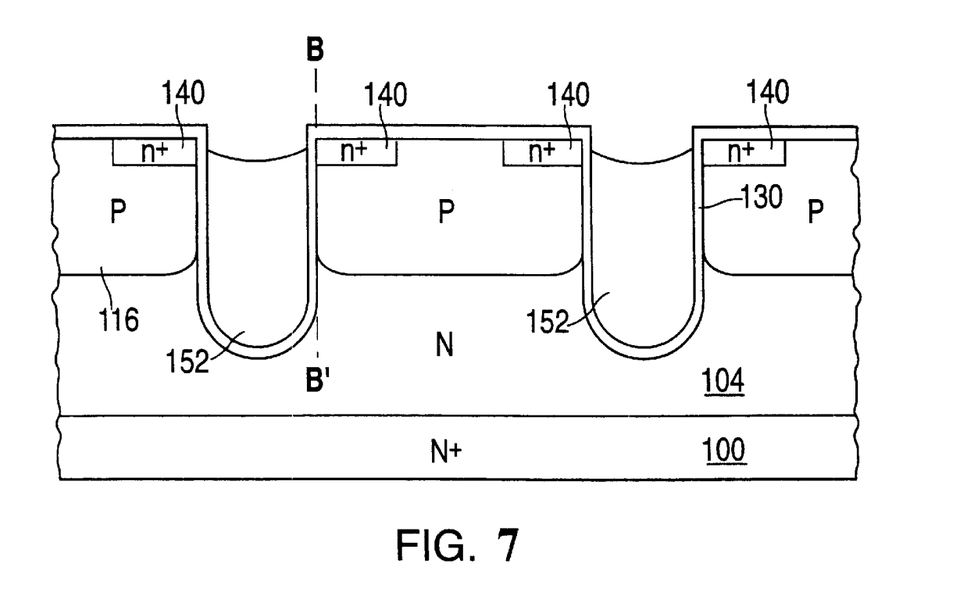

In FIG. 6 the polysilicon layer 152 is etched to optimize its thickness and to expose the portion of the gate oxide layer 130 that extends over the surface of p-body 116. Next, a photoresist masking process is used to form patterned masking layer 160. Patterned masking layer 160 defines source regions 140. Source regions 140 are then formed by an implantation and diffusion process. For example, the source regions may be implanted with arsenic at 80 KEV to a concentration that is typically in the range of $8 \times 10^{15}$ to $1.2 \times 10^{16}$. After implantation, the arsenic is diffused to a depth of approximately 0.5 microns. Finally, masking layer 160 is removed in a conventional manner to form the structure depicted in FIG. 7.

The trench DMOS transistor is completed in a conventional manner by forming and patterning a BPSG layer over the structure to define BPSG regions associated with the gate electrodes. Also, a drain contact layer is formed on the bottom surface of the substrate. Finally, a pad mask is used to define pad contacts.

Figure 8:
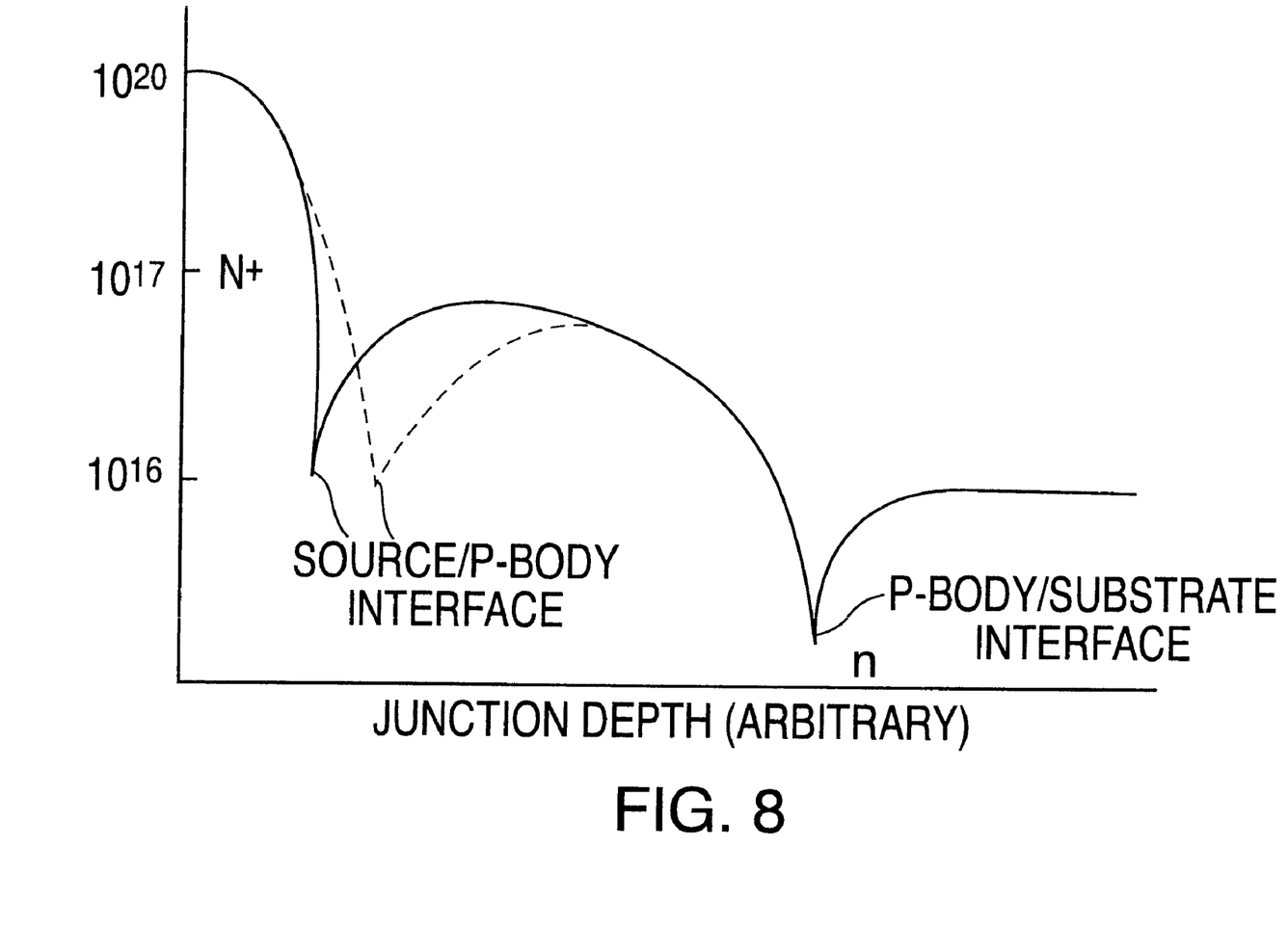
FIG. 8 shows the dopant concentration through the transistor when the trench is completely formed before removal of the trench mask in accordance with the inventive method (solid line) and when the trench is fabricated in a conventional manner (dashed line).

FIG. 8 shows a model of the dopant concentration through the transistor when the trench is completely formed before removal of the trench mask in accordance with the inventive method (solid line) and when the trench is fabricated in a conventional manner (dashed line). The locations of the various interfaces are indicated on graph. Clearly, the model indicates that less dopant material leaches out of the p-body when the fabrication technique of the present invention is employed, thus advantageously providing a thicker p-body so that punch-through is reduced.

Figure 9:
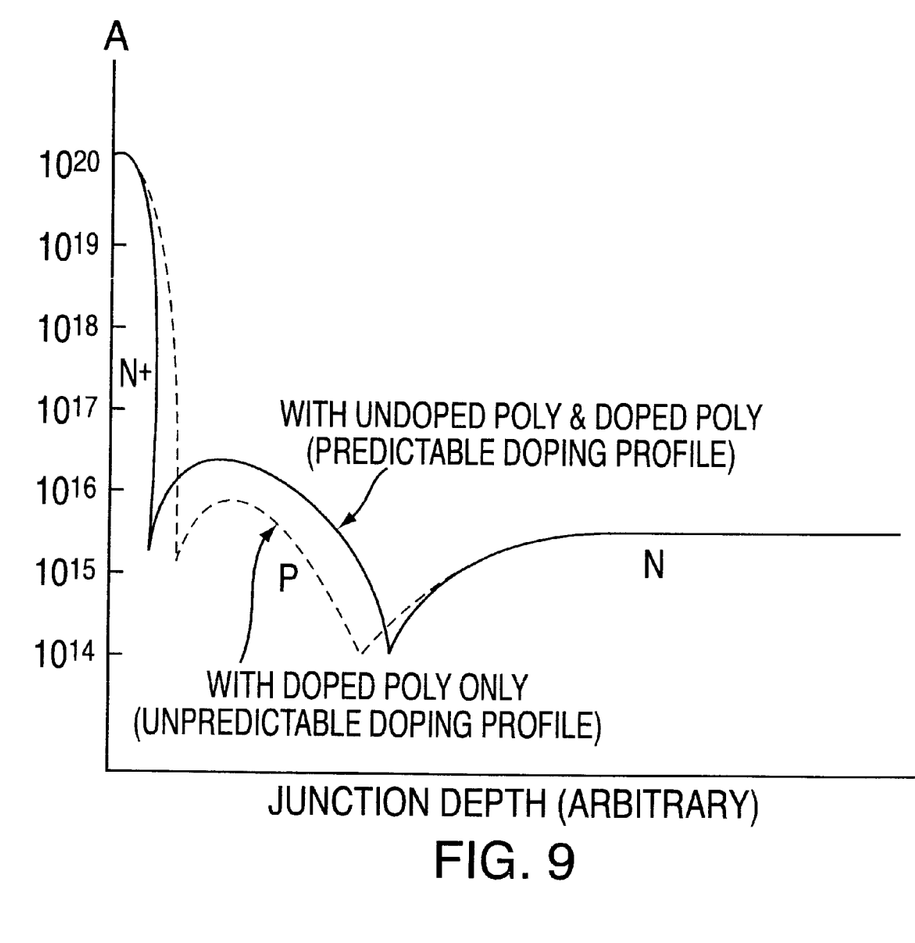
FIG. 9 shows the dopant concentration through the transistor when the trench is filled only with doped polysilicon (dashed line) and when the trench is lined with a layer of undoped polysilicon followed by doped polysilicon (solid line).

FIG. 9 shows the dopant concentration through the transistor when the trench is filled only with doped polysilicon (dashed line) and when the trench is lined with a layer of undoped polysilicon followed by doped polysilicon (solid line). The dopant concentration in the p-body is greater and the p-body region thicker when a layer is provided of both doped and undoped polysilicon.

In accordance with another aspect of the present invention, punch-through may also be reduced by filling the trench with polysilicon in a two step process. In the first step, a layer of undoped polysilicon is deposited to line the sidewalls of the trenches. The undoped polysilicon layer is followed by the deposition of a layer of doped polysilicon. Typically, the thickness of the doped polysilicon layer is greater than the thickness of the undoped polysilicon layer. For example, the ratio of the thickness of the doped polysilicon layer to the undoped polysilicon layer may be 7:1, with a total thickness of about 8,000 Å. The undoped polysilicon layer is advantageously employed as a buffer layer to inhibit the penetration of dopant material through the gate oxide layer and into the p-body, thus further reducing punch-through. This two step process may be used when the trench is formed prior to the removal of the trench mask. Alternatively, the two layer deposition process may be used by itself to reduce punch through. That is, the trench may be filled with undoped and doped layers of polysilicon even when the trench mask is removed before the formation of the trench.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a trench DMOS in which the conductivities of the various semiconductor regions are reversed from those described herein.

What is claimed is:

1. A trench DMOS transistor cell, comprising;

a substrate of a first conductivity type;

an epitaxial layer of the first conductivity type grown on said substrate;

a body region on the epitaxial layer, said body region having a second conductivity type;

at least one trench extending through the body region and into the epitaxial layer grown on said substrate, an insulating layer that lines the trench;

a conductive electrode in the trench overlying the insulating layer, said conductive electrode including a deposited substantially uniformly doped layer grown on a deposited undoped layer; and a source region of a first conductivity type in the body region adjacent to the trench, wherein the substantially uniformly doped layer is uniformly to a level that results from being formed in a deposition process.

2. The DMOS transistor cell of claim 1 wherein said conductive electrode includes a layer of undoped polysilicon and a layer of doped polysilicon.

3. The DMOS transistor cell of claim 1 further comprising a drain electrode disposed on a surface of the substrate opposing the body region.

4. The DMOS transistor cell of claim 1 wherein said insulating layer is an oxide layer.

* * * * *

UNITED STATES PATENT AND TRADEMARK OFFICE
CERTIFICATE OF CORRECTION

PATENT NO.    : 6,518,621 B1
DATED         : February 11, 2003
INVENTOR(S)   : Fwu-Iuan Hshieh et al.

It is certified that error appears in the above-identified patent and that said Letters Patent is hereby corrected as shown below:

<u>Title page,</u>
Item [57], ABSTRACT,
Line 1, after "is", change "provides" to -- provided --.

<u>Column 2,</u>
Line 8, after "adversely," change "effected" to -- affected --.
Line 42, after "leaching", delete "leach".
Line 50, before "punch-through", change "reduces" to -- reduce --.
Line 60, after "FIGS. 2-7," change "illustrates" to -- illustrate --.

<u>Column 3,</u>
Line 57, after "FIGS. 2-7," change "shows" to -- show --.
Line 65, after "dosage of", change "5.5X10$^3$/cm$^3$" to -- 5.5 X10$^{13}$/cm$^3$ --.

<u>Column 4,</u>
Line 25, after "technique," change "punchthrough" to -- punch-through --.
Line 61, before "graph", insert -- the --.

<u>Column 6,</u>
Line 22, before "to a level", change "uniformly" to -- uniform --.

Signed and Sealed this

Sixteenth Day of September, 2003

JAMES E. ROGAN
*Director of the United States Patent and Trademark Office*